United States Patent [19]
Poduje et al.

[11] Patent Number: 5,456,561
[45] Date of Patent: * Oct. 10, 1995

[54] ROBOT PREALIGNER

[75] Inventors: Noel S. Poduje, Needham Heights; Roy S. Mallory, Bedford, both of Mass.

[73] Assignee: ADE Corporation, Newton, Mass.

[*] Notice: The portion of the term of this patent subsequent to Jul. 26, 2011 has been disclaimed.

[21] Appl. No.: 273,720

[22] Filed: Jul. 12, 1994

Related U.S. Application Data

[63] Continuation of Ser. No. 863,819, Apr. 6, 1992, Pat. No. 5,332,352, which is a continuation of Ser. No. 320,276, Mar. 7, 1989, Pat. No. 5,102,280.

[51] Int. Cl.$^6$ ................................................. B25J 9/06
[52] U.S. Cl. .................. 414/225; 414/744.6; 414/744.5; 414/749; 414/786; 901/6; 901/15
[58] Field of Search ............................. 414/225, 744.5, 414/744.6, 744.8, 749, 786; 901/15, 21, 6

[56] References Cited

U.S. PATENT DOCUMENTS

| Re. 30,914 | 4/1982 | Chisum ................................. 72/457 |
|---|---|---|
| 3,694,741 | 9/1972 | Abbe ..................................... 324/60 |
| 3,706,919 | 12/1972 | Abbe . |
| 3,771,051 | 11/1973 | Abbe ..................................... 324/61 |
| 3,775,678 | 11/1973 | Abbe ..................................... 324/60 |
| 3,775,679 | 11/1973 | Abbe ..................................... 324/61 |
| 3,805,150 | 4/1974 | Abbe ..................................... 324/61 R |
| 3,812,424 | 5/1974 | Abbe ..................................... 324/61 |
| 3,815,111 | 6/1974 | Abbe ..................................... 340/213 |
| 3,958,682 | 5/1976 | Martin ................................... 198/19 |
| 3,986,109 | 10/1976 | Poduje .................................. 324/61 |
| 3,990,005 | 11/1976 | Abbe et al. ........................... 324/61 |
| 4,042,161 | 8/1977 | Ando .................................... 228/102 |
| 4,047,448 | 9/1977 | Pardo et al. ......................... 74/417 |
| 4,076,131 | 2/1978 | Dahlstrom et al. ................. 214/1 BC |

(List continued on next page.)

FOREIGN PATENT DOCUMENTS

| 1108668 | 9/1981 | Canada . |
|---|---|---|
| 0074829 | 3/1983 | European Pat. Off. ........ G05B 19/44 |
| 0078251 | 5/1983 | European Pat. Off. ........... B25J 9/00 |
| 0084249 | 7/1983 | European Pat. Off. ........... B25J 9/00 |
| 0189483 | 8/1986 | European Pat. Off. ........... B25J 9/06 |
| 0200162 | 11/1986 | European Pat. Off. ........ B25K 11/36 |
| 0267109 | 5/1988 | European Pat. Off. ........ B23K 11/30 |
| 0317788 | 5/1989 | European Pat. Off. ........ B65G 67/60 |
| 0333928 | 9/1989 | European Pat. Off. ........ G01D 5/249 |
| 2551378 | 3/1985 | France . |
| 2560546 | 9/1985 | France . |
| 2590197 | 5/1987 | France . |
| 2590337 | 5/1987 | France . |
| 2593107 | 7/1987 | France . |
| 222540 | 5/1985 | German Dem. Rep. . |
| 257481 | 6/1988 | German Dem. Rep. . |
| 270677 | 8/1989 | German Dem. Rep. . |
| 2352945 | 4/1975 | Germany . |
| 2717221 | 11/1978 | Germany ......................... B25J 15/00 |
| 3002012 | 8/1980 | Germany ......................... B25J 9/00 |
| 3222422 | 12/1983 | Germany ......................... B25J 9/00 |
| 3312483 | 10/1984 | Germany ......................... B25J 15/00 |
| 3543335 | 6/1987 | Germany ......................... B25J 18/06 |
| 3734179 | 4/1989 | Germany ......................... B25J 17/00 |

(List continued on next page.)

OTHER PUBLICATIONS

Rorze Corporation reference machine drawing, (1 page, 1986).
Fumio Sakiya, article from a Japanese magazine, Aug. 1987, pp. 54–56.

*Primary Examiner*—Donald W. Underwood
*Attorney, Agent, or Firm*—Weingarten, Schurgin, Gagnebin & Hayes

[57] ABSTRACT

An alignment station for elements such as semiconductor wafers on a robot arm uses a rotating support and edge detector which in combination are operative to place a wafer on the rotating support, detect wafer alignment, move the wafer to bring it into alignment either on the rotating support itself or onto a separate station.

21 Claims, 3 Drawing Sheets

U.S. PATENT DOCUMENTS

| | | | |
|---|---|---|---|
| 4,138,876 | 2/1979 | Chisum | 72/457 |
| 4,158,171 | 6/1979 | Abbe et al. | 324/158 |
| 4,217,542 | 8/1980 | Abbe et al. | 324/57 |
| 4,221,997 | 9/1980 | Flemming | 318/574 |
| 4,228,392 | 10/1980 | Abbe et al. | 324/61 |
| 4,267,424 | 5/1981 | Shimatake et al. | 219/86.41 |
| 4,273,504 | 6/1981 | Shimatake et al. | 414/728 |
| 4,300,362 | 11/1981 | Lande et al. | 64/17 R |
| 4,353,029 | 10/1982 | Abbe et al. | 324/236 |
| 4,353,677 | 10/1982 | Susnjara et al. | 414/735 |
| 4,356,378 | 10/1982 | Cloos et al. | 219/124.1 |
| 4,383,455 | 5/1983 | Tuda et al. | 74/469 |
| 4,392,776 | 7/1983 | Shum | 414/744 B |
| 4,398,720 | 8/1983 | Jones et al. | 273/238 |
| 4,398,863 | 8/1983 | Shum | 414/733 |
| 4,399,718 | 8/1983 | Zimmer | 74/409 |
| 4,403,281 | 9/1983 | Holmes et al. | 364/170 |
| 4,430,037 | 2/1984 | Bisiach | 414/4 |
| 4,438,309 | 3/1984 | Zimmer | 219/86.7 |
| 4,455,120 | 6/1984 | Richter | 414/719 |
| 4,457,664 | 7/1984 | Judell et al. | 414/779 |
| 4,466,454 | 8/1984 | Layton | 134/76 |
| 4,479,754 | 10/1984 | Inaba et al. | 414/728 |
| 4,483,074 | 11/1984 | Rudzyanskas et al. | 33/1 M |
| 4,492,510 | 1/1985 | Tanii et al. | 414/733 |
| 4,496,278 | 1/1985 | Kaise | 414/735 |
| 4,496,279 | 1/1985 | Langer | 414/735 |
| 4,503,722 | 3/1985 | Suzuki et al. | 74/96 |
| 4,507,043 | 3/1985 | Flatau | 414/719 |
| 4,507,046 | 3/1985 | Sugimoto et al. | 414/735 |
| 4,507,534 | 3/1985 | Kaufmann et al. | 219/86.7 |
| 4,514,136 | 4/1985 | Abe | 414/744 A |
| 4,538,047 | 8/1985 | Nakano et al. | 219/125.1 |
| 4,542,278 | 9/1985 | Taylor | 219/121 LV |
| 4,542,845 | 9/1985 | Fuse | 228/45 |
| 4,547,120 | 10/1985 | Turner, Jr. et al. | 414/744 R |
| 4,548,097 | 10/1985 | Zimmer | 74/665 M |
| 4,552,505 | 11/1985 | Gorman | 414/735 |
| 4,555,613 | 11/1985 | Shulman | 219/124.34 |
| 4,556,360 | 12/1985 | Hoffman | 414/701 |
| 4,563,122 | 1/1986 | Daly et al. | 414/732 |
| 4,574,175 | 3/1986 | Javanovic | 219/86.1 |
| 4,575,299 | 3/1986 | Layton et al. | 414/222 |
| 4,576,537 | 3/1986 | Inaba et al. | 414/222 |
| 4,585,387 | 4/1986 | Jayne | 414/730 |
| 4,586,911 | 5/1986 | Murakami | 446/376 |
| 4,592,697 | 6/1986 | Tuda et al. | 414/733 |
| 4,593,900 | 6/1986 | Burke | 272/76 |
| 4,594,049 | 6/1986 | Terauchi | 414/744 R |
| 4,601,635 | 7/1986 | Ito et al. | 414/730 |
| 4,610,598 | 9/1986 | Hamada et al. | 411/744 A |
| 4,611,749 | 9/1986 | Kawano | 228/176 |
| 4,619,575 | 10/1986 | Summa et al. | 414/280 |
| 4,620,831 | 11/1986 | Poncet et al. | 414/744 |
| 4,621,332 | 11/1986 | Sugimoto et al. | 364/513 |
| 4,624,043 | 11/1986 | Bennett | 29/568 |
| 4,624,621 | 11/1986 | Murakami et al. | 414/735 |
| 4,626,165 | 12/1986 | Nakashima et al. | 414/735 |
| 4,630,992 | 12/1986 | Gilli et al. | 414/744 R |
| 4,636,138 | 1/1987 | Gorman | 414/735 |
| 4,637,773 | 1/1987 | Nakashima et al. | 414/732 |
| 4,637,774 | 1/1987 | Nakamura et al. | 414/735 |
| 4,638,234 | 1/1987 | Schroder et al. | 318/661 |
| 4,642,021 | 2/1987 | Kikuchi | 414/735 |
| 4,644,897 | 2/1987 | Fender | 118/323 |
| 4,646,009 | 2/1987 | Mallory | 324/158 |
| 4,659,280 | 4/1987 | Akeel | 414/720 |
| 4,661,040 | 4/1987 | Cigna | 414/744 R |
| 4,664,232 | 5/1987 | Takagi et al. | 188/74 |
| 4,667,443 | 5/1987 | Sakurai et al. | 51/99 |
| 4,668,155 | 5/1987 | Kaufmann et al. | 414/680 |
| 4,674,947 | 6/1987 | Hamada et al. | 414/735 |
| 4,675,502 | 6/1987 | Haefner et al. | 219/124.34 |
| 4,682,932 | 7/1987 | Yoshino | 414/744 A |
| 4,684,312 | 8/1987 | Antoszewski et al. | 414/735 |
| 4,685,349 | 8/1987 | Wada et al. | 74/479 |
| 4,688,985 | 8/1987 | Hartmann | 414/744 R |
| 4,692,695 | 9/1987 | Poduje | 324/158 |
| 4,693,663 | 9/1987 | Brenholt et al. | 414/735 |
| 4,696,612 | 9/1987 | Germond et al. | 414/8 |
| 4,697,978 | 10/1987 | Tada et al. | 414/729 |
| 4,698,483 | 10/1987 | Marinoni et al. | 219/121 LU |
| 4,704,065 | 11/1987 | Allared | 414/735 |
| 4,706,004 | 11/1987 | Komatsu et al. | 318/568 |
| 4,710,092 | 12/1987 | Skoog et al. | 414/729 |
| 4,716,350 | 12/1987 | Huang et al. | 318/568 |
| 4,728,247 | 3/1988 | Nakashima et al. | 414/680 |
| 4,730,975 | 3/1988 | Munakata | 414/735 |
| 4,733,576 | 3/1988 | Zimmer et al. | 74/665 L |
| 4,741,078 | 5/1988 | Kimura | 29/39 |
| 4,748,867 | 6/1988 | Susnjara | 74/479 |
| 4,750,141 | 6/1988 | Judell et al. | 364/550 |
| 4,753,824 | 6/1988 | Toda et al. | 427/286 |
| 4,755,333 | 7/1988 | Gray | 264/37 |
| 4,758,036 | 7/1988 | Legille et al. | 294/86.4 |
| 4,761,114 | 8/1988 | Barland | 414/735 |
| 4,768,918 | 9/1988 | Gorman et al. | 414/719 |
| 4,775,289 | 10/1988 | Kazerooni | 414/735 |
| 4,776,230 | 10/1988 | Susnjara | 74/479 |
| 4,784,010 | 11/1988 | Wood et al. | 74/479 |
| 4,786,227 | 11/1988 | Kremer et al. | 414/10 |
| 4,793,203 | 12/1988 | Staggl et al. | 74/479 |
| 4,798,321 | 1/1989 | Moran | 228/213 |
| 4,803,895 | 2/1989 | Nishizawa et al. | 74/603 |
| 4,807,273 | 2/1989 | Haendle | 378/197 |
| 4,807,486 | 2/1989 | Akeel et al. | 74/479 |
| 4,819,167 | 4/1989 | Cheng et al. | 364/167.01 |
| 4,820,113 | 4/1989 | Farquhar | 414/736 |
| 4,821,207 | 4/1989 | Minget et al. | 364/513 |
| 4,822,200 | 4/1989 | Berner | 403/229 |
| 4,823,279 | 4/1989 | Perzley et al. | 364/513 |
| 4,827,689 | 5/1989 | Lonardi et al. | 52/749 |
| 4,827,954 | 5/1989 | Layton | 134/76 |
| 4,835,995 | 6/1989 | Vacant | 69/6.5 |
| 4,843,561 | 6/1989 | Larson | 364/478 |
| 4,845,992 | 7/1989 | Dean | 72/7 |
| 4,848,641 | 7/1989 | Park et al. | 228/37 |
| 4,849,916 | 7/1989 | Abbe et al. | 364/563 |
| 4,850,782 | 7/1989 | Focke | 414/793 |
| 4,859,139 | 8/1989 | Torii et al. | 414/744.5 |
| 4,860,229 | 8/1989 | Abbe et al. | 364/563 |
| 4,861,087 | 8/1989 | Park | 294/119.1 |
| 4,864,438 | 9/1989 | Munro | 360/92 |
| 4,864,888 | 9/1989 | Iwata | 74/640 |
| 4,874,286 | 10/1989 | Koster et al. | 414/744.5 |
| 4,878,393 | 11/1989 | Duta et al. | 74/479 |
| 4,881,863 | 11/1989 | Braginsky | 414/225 |
| 4,882,527 | 11/1989 | Yakuyama et al. | 318/568.13 |
| 4,892,992 | 1/1990 | Akeel et al. | 219/121.78 |
| 4,898,416 | 2/1990 | Hubbard et al. | 294/119 |
| 4,899,145 | 2/1990 | Okuda et al. | 341/15 |
| 4,901,627 | 2/1990 | Schulze | 91/374 |
| 4,904,153 | 2/1990 | Iwasawa et al. | 414/735 |
| 4,908,777 | 3/1990 | Wolfe | 364/513 |
| 4,910,453 | 3/1990 | Abbe et al. | 324/663 |
| 4,911,597 | 3/1990 | Maydan et al. | 414/217 |
| 4,915,574 | 4/1990 | Park et al. | 414/680 |
| 4,931,962 | 6/1990 | Palleiko | 364/550 |
| 4,941,106 | 7/1990 | Krieger | 364/513 |
| 4,945,429 | 7/1990 | Munro et al. | 360/92 |
| 4,946,337 | 8/1990 | Tonai et al. | 414/744.5 |
| 4,951,517 | 8/1990 | Azuma et al. | 74/209 |

| | | |
|---|---|---|
| 4,964,362 | 10/1990 | Dominguez .............................. 118/315 |
| 4,969,108 | 11/1990 | Webb et al. ............................. 364/513 |
| 4,972,347 | 11/1990 | Tarvin et al. ........................ 364/474.28 |
| 4,986,724 | 1/1991 | Steinmetz et al. ...................... 414/729 |
| 4,995,286 | 2/1991 | Kobayashi et al. ...................... 82/101 |
| 5,014,183 | 5/1991 | Carpenter et al. ................. 364/167.01 |
| 5,080,415 | 1/1992 | Bjornson .............................. 294/119.1 |
| 5,102,280 | 4/1992 | Poduje et al. .......................... 414/225 |
| 5,332,352 | 7/1994 | Poduje et al. .......................... 414/225 |

FOREIGN PATENT DOCUMENTS

| | | |
|---|---|---|
| 3831785 | 3/1990 | Germany ...................... B05C 11/10 |
| 3932013 | 5/1990 | Germany ........................ B25J 9/00 |
| 62-00286 | 11/1987 | Japan ............................. B25J 17/00 |
| 63-179295 | 7/1988 | Japan . |
| 659376 | 4/1979 | U.S.S.R. . |
| 865650 | 9/1981 | U.S.S.R. . |
| 889418 | 12/1981 | U.S.S.R. . |
| 1108005 | 8/1984 | U.S.S.R. ............................ B25J 9/00 |
| 1125127 | 11/1984 | U.S.S.R. .......................... B25J 11/00 |
| 1127765 | 12/1984 | U.S.S.R. . |
| 1220781 | 3/1986 | U.S.S.R. . |
| 1220787 | 3/1986 | U.S.S.R. .......................... B25J 11/00 |
| 1425036 | 9/1988 | U.S.S.R. .......................... B23Q 7/04 |
| 2085398 | 4/1982 | United Kingdom ............... B25J 9/00 |
| 2087837 | 6/1982 | United Kingdom ............. B25J 17/00 |
| 2115778 | 9/1983 | United Kingdom ............... B25J 9/00 |
| 2118524 | 11/1983 | United Kingdom ............... B25J 9/00 |
| 2164263 | 3/1986 | United Kingdom ........... A63H 17/02 |

ROBOT PREALIGNER

RELATED APPLICATION

This application is a continuation of application Ser. No. 07/863,819, filed Apr. 6, 1992, now U.S. Pat. No. 5,332,352, entitled: ROBOT PREALIGNER, which is a continuation of application Ser. No. 07/320,276, filed Mar. 7, 1989, entitled: ROBOT PREALIGNER, and issued as U.S. Pat. No. 5,102,280 on Apr. 7, 1992.

FIELD AND BACKGROUND OF THE INVENTION

The present invention relates to robot arm manipulators for elements and means for aligning objects on the robot arm into a predetermined position.

Robot arms are increasingly being utilized for moving objects from one location to another. In the application of robotics to semiconductor wafer processing as shown in the U.S. Pat. No. 4,897,015, issued on Jan. 30, 1990 commonly assigned herewith, a robot arm is useful in conveying a semiconductor wafer from one location to another through the use of independently controllable radial, circumferential and elevational motions. For many purposes, however, it is important that the wafer transported by the robot arm must be placed in a predetermined alignment with respect to its centroid and fiducial.

BRIEF SUMMARY OF THE INVENTION

According to the teaching of the present invention a robot arm is operative with an alignment station to adjust the orientation of a wafer or other element on the robot arm to a predetermined alignment for use by the robot arm in placing the wafer at a neighboring station in a desired orientation.

In particular implementation the robot arm includes a manipulator having independently controlled and isolated radial, circumferential and elevational motions (r, θ, z). A rotating support is provided within the range of placement for a semiconductor wafer carried by the robot arm and has associated with it an edge detector which determines the location of a wafer edge as it is rotated on the rotary support. The robot arm executes r θ z independent commands to cradle a wafer on its end effector or hand from a first location. The robot arm then places the wafer upon the rotary support where it is spun with the edge over the edge detector. The edge location is detected by electronics which determines the amount of motion of the centroid to produce alignment of the wafer on the rotary support and/or to locate the wafer fiducial in a predetermined location. The robot arm is then manipulated in a first case to move the wafer on the rotary support until alignment is secured with the fiducial relocated to a predetermined position. The wafer is again picked up by the robot arm for delivery to a further station in predetermined alignment. In a second case the robot arm is operative to pick up the wafer with the known misalignment and correct for such misalignment in delivering the wafer to a subsequent station.

BRIEF DESCRIPTION OF THE DRAWING

These and other features of the present invention are more fully illustrated below in the solely exemplary detailed description and accompanying drawing of which.

DETAILED DESCRIPTION

Figure 1:
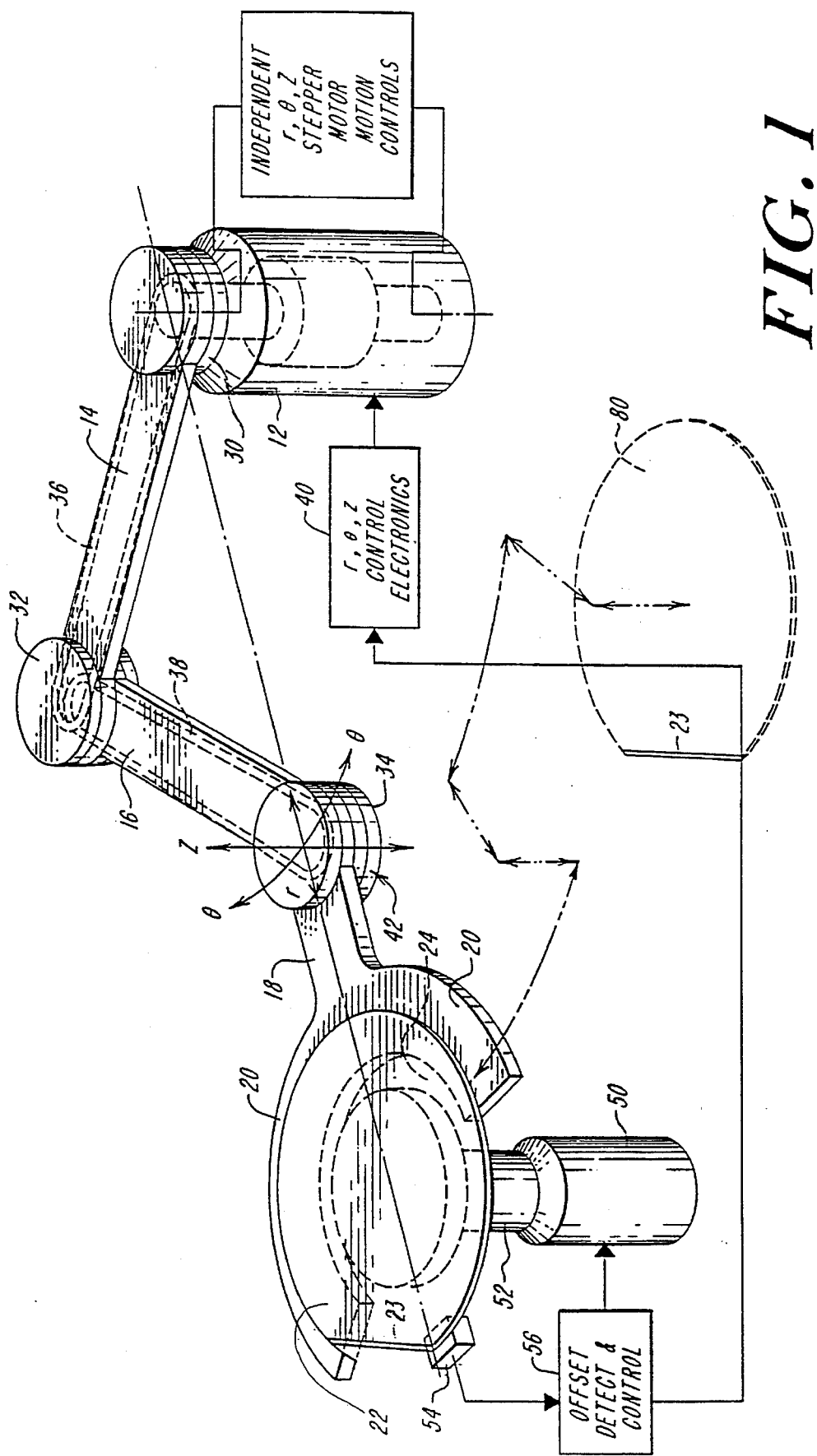
FIG. 1 shows a perspective view of a robot arm and alignment aid according to the present invention.

The present invention contemplates an alignment aid for a robot arm which permits the alignment of an element such as a semiconductor wafer, being manipulated and transported by the arm, to be adjusted in alignment for delivery to a predetermined location with a predetermined alignment.

In commonly assigned U.S. Pat. No. 4,897,015, issued on Jan. 30, 1990 specifically incorporated herein by reference, there is illustrated a robot arm of the type shown in FIG. 1. As shown there a robot arm comprises a base support 12 outward from which is a cantilevered multi-leg robot arm having first and second arms 14 and 16 and a terminal end effector 18. The end effector 18 in the embodiment for use in semiconductor wafer handling includes a "Y" shaped termination having fingers 20 adapted to cradle a semiconductor wafer 22 while leaving a center portion 24 uncovered for placing of the wafer upon diverse instruments.

The leg 14 is joined to the base member 12 through a pivot housing 30. The legs 14 and 16 are pivotally joined through a pivot housing 32. The leg 16 and the hand 18 are joined through a pivot housing 34. A pulley within the housing 32, and fixed to the leg 16, has a diameter of one normalized unit. A belt 36 is wrapped around that pulley and extends to a pulley of two normalized units diameter within the housing 30. A pulley of one normalized unit diameter within the housing 32 is affixed to the leg 14 and has wrapped about it a belt 38 which is wrapped about a pulley of two normalized units diameter which is in turn affixed to the hand 18.

The base member 12 contains three motion systems, independently controllable by a r θ z control electronics 40. Electronics 40 control individual motional systems within the base member 12 which produce independent r θ z motion along the axis generally located at 42. It will be appreciated that the r direction of motion is strictly linear along a line passing through the center of the wafer 22 and the center or rotational axis of the housings 34 and 30. Such r motion is accomplished by rotating the leg 14 about the axis of the housing 30 while maintaining the pulley of two normalized units diameter fixed within the housing 30. θ motion is accomplished by rotating the entire housing 30 and leg 14 as a unit, while z motion is accomplished by elevating the housing 30 and arm 14 as a unit, or alternatively by elevating the base 12 above a support.

The ratio of pulley couplings and their arrangement produces a strictly r or radial motion of the hand 18 independent of motion in either θ or z. Also both θ and z motions are produced by the motor systems within the base 12 as independent motions with respect to the other two axis.

A pedestal 50 rotationally supports a vacuum chuck 52 on which the wafer 22 may be supported with the vacuum chuck supported to hold the wafer in the region 24 between the fingers 20 of the hand 18. Combined r θ z motion of the robot arm can position the wafer 20 over the vacuum chuck while the arm is then lowered to transfer support for the wafer from the hand 18 to the vacuum chuck 52.

An edge sensor 54 of capacitive or other design is provided to detect the position of the edge of the semiconductor wafer 22 as it is rotated by the vacuum chuck 52. That positional information is provided to an offset detect and control circuit 56 which, in accordance with the teaching of U.S. Pat. No. 4,457,664, determines the amount and angle of misalignment of the wafer 22 upon the vacuum chuck 52 and correspondingly of the degree to which the wafer was misaligned upon the hand 18 when originally transferred from the hand to the vacuum chuck 52.

Figure 2:
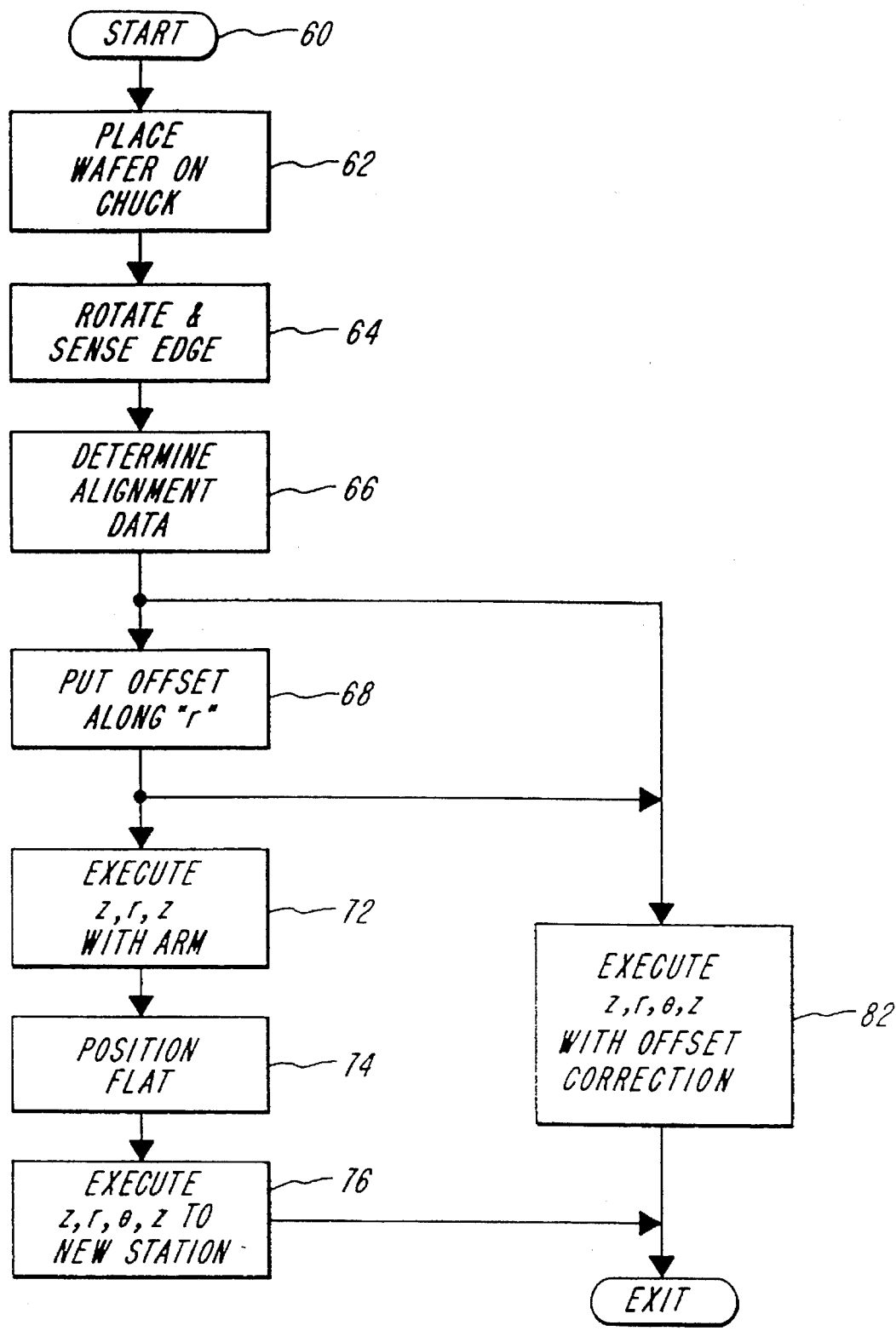
FIG. 2 illustrates operation of the system of FIG. 1.

In one case this information is utilized in accordance with the processing of FIG. 2 to align the wafer 22 upon the vacuum chuck 52 and to return it to the hand 18 in a predetermined alignment condition. In particular, and as illustrated in FIG. 2, from a start state 60 the robot arm is controlled by the motion systems within the base 12 to place the wafer on the vacuum chuck 52 in a step 62. In a subsequent step 64 the vacuum chuck 52 is rotated by the motor support 50. The position of the edge is detected by the sensor 54 and processed by electronics 56 to identify the position of the wafer centroid relative to the center of rotation of the vacuum chuck 52 in step 66. In subsequent step 68 the vacuum chuck 52 positions the wafer so that the offset lies along an axis 70 which is the axis through the center of the vacuum chuck in the center of the housing 30. The robot arm is then activated in step 72 and the wafer picked up by the hand 18 and moved along the axis 70, strictly in linear motion along the r direction, to reposition the wafer upon the vacuum chuck 52 so that its centroid is positioned upon the axis of rotation. Steps 64 through 68 may be repeated one or more times for verification or for error minimization purposes.

Thereafter in step 74 the position of an artifact such as the fiducial or flat on the wafer 22 is placed in a predetermined location and in a subsequent step 76 the robot arm is activated and the wafer transferred to the hand 18 with a now predetermined known alignment. With a predetermined number of independently controlled and quantified steps in the r, θ, z directions produced by the motional systems within the base 12, the wafer 22 may be repositioned at a predetermined subsequent station, such as station 80, with a predetermined alignment.

Alternatively, in a second case, the operation may branch after steps 66 or 68 to a step 82 in which the wafer 22 is transferred to the hand 18 prior to realignment on the vacuum chuck 52, but with a known degree of misalignment. The wafer 22 is then transferred by the robot arm under the control of the motion systems in the base 12 to move the wafer 28 a prescribed number of steps in independent r, θ, z direction, with a misalignment offset calculated into the motional steps, to position the wafer at the station 80 in the same predetermined alignment.

Since the robot arm of FIG. 1 may have a small amount of slack or backlash, a specific sequence of motions for the steps 72, 76 and 82 is preferable. Generally the robot arm will execute a preliminary motion in one or both r and θ prior to pick up of an aligned wafer, or wafer with known misalignment, in the same direction as the motion in r and θ that the arm will conclude its motion with after delivering the wafer in an aligned state back to the pedestal or to a desired destination. If there is slack in the arm, such preliminary motion will insure that the arm is at the same extremity of the slack at both ends of its critical motion with an aligned wafer thus cancelling much of the slack in the motion.

The use of a flexible positioning device such as the robot arm of FIG. 1 capable of positioning the wafer in independently controllable, three axes motion and in particular in independently controllable r, θ, z motion provides a great deal of flexibility in element transport, particularly semiconductor wafer processing and testing. In addition, the multi axis transfer mechanism of the robot arm permits some or all misalignment of the wafer to be corrected by the transfer mechanism itself.

Figure 3:
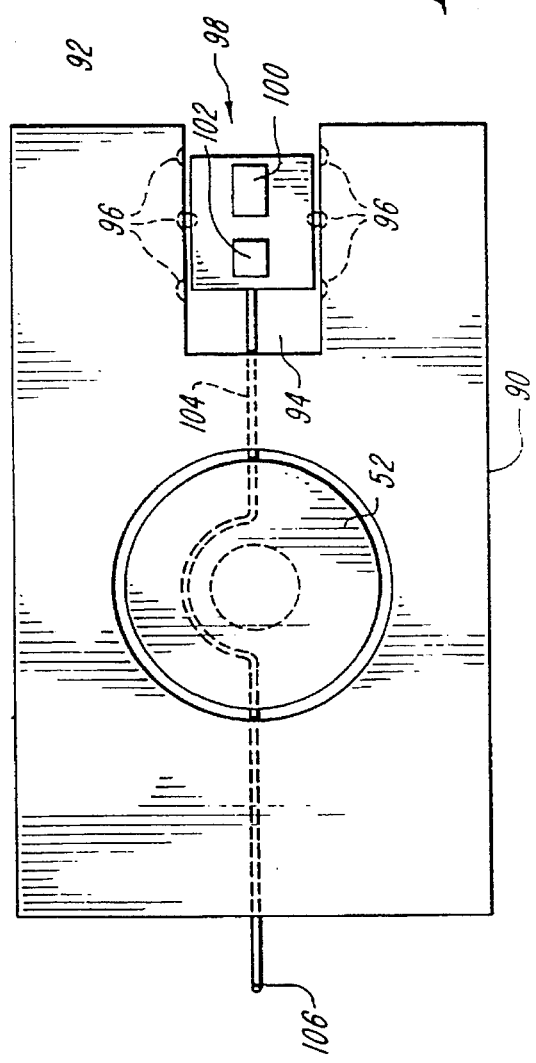
FIG. 3 is a top view of a prealigner assembly having an edge sensor selectively positionable to accomodate different wafers.
Figure 4:
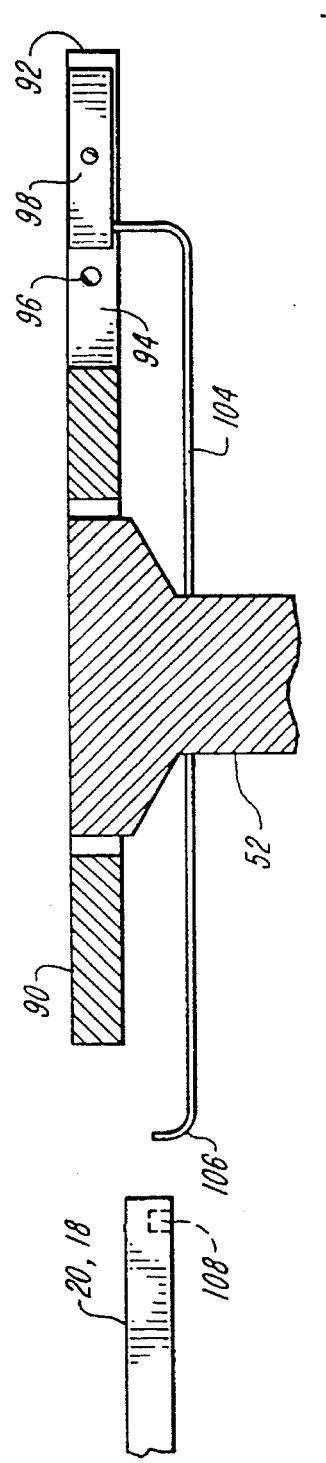
FIG. 4 is a sectional view of the assembly of FIG. 3

FIGS. 3 and 4 illustrate an alternative assembly for the prealigner support 52 and sensor 54. As shown there, the support 52 is surrounded by a platform 90 having at an end 92 a slot 94. Detents 96 are placed along the facing sides of the slot 94. An edge sensor 98 rides in the slot 94 in a horizontal direction and is restrained by guides, not shown, to travel precisely in that horizontal direction. The sensor 98 contains spring loaded projections, such as ball and socket assemblies, that click into respective detents 96 as the sensor moves horizontally to maintain the sensor in a corresponding one of several known positions. Each such position is established so that an edge sensing electrode 100 in sensor 98 is set to span the edge of a wafer of predetermined size when roughly centered on support 52. The detents 96 provide placement of electrode 100 at positions corresponding to wafers of different sizes. Electrode 102 provides height compensation as described in the above referenced patent.

An arm 104 leads from the sensor assembly 98 to a hook 106, on a side of the platform 90 facing the end effector 18. A trough 108 is provided in a bottom face of a finger 20 to receive the upward projection portion of hook 106.

The central electronics 40 receives an input identifying the size of the next wafer, either from manual entry, or from a further controller for overall wafer processing that identifies diameters of a sequence of wafers to be selected, for example, from a cassette by the end effector 18. To set the sensor assembly 98 to the detent for that wafer diameter, the controller 40, using a memory identification of the current assembly 98 location, causes end effector 18 to execute an r, θ, z sequence that grasps hook 106 in trough 108 and repositions the assembly 98. Alternatively, after initialization, the controller 40 causes finger 20 to move to a predetermined height and push hook 106, whatever its position, to move the assembly 98 to the outermost detent and then positions the hook 106 in trough 108 to reposition assembly 98 as desired.

Other mechanisms than that specifically exemplified above are capable of producing the same result of the present invention and accordingly it is intended to cover such embodiments to the extent they fall within the scope of the following claims.

We claim:

1. A system for combined element transport and alignment comprising:

a pedestal having a reference position;

means for determining a first position of an element having a centroid and a flat on said pedestal relative to said reference position, said first position having associated therewith an offset of the centroid and an angle of the flat relative to said reference position;

a linear manipulator having an element holder on an articulated two leg arm, said manipulator having means for angling the legs of the arm to produce a first direction of motion for said holder along a straight line, having means for providing both a second direction of motion about an axis and a third direction of motion in elevation, and having means for maintaining the angular position of the holder during motion of the holder in the first direction of motion; and means for controlling the movement of the linear manipulator to move said element on said holder from said first position to a second position, wherein said second position has associated therewith a predetermined offset and angle relative to said reference position.

2. The system recited in claim 1 wherein said pedestal comprises a rotatable holding means for holding said element and wherein said reference position corresponds to a center of rotation of said holding means.

3. The system recited in claim 1 wherein said second position is along said straight line associated with said first direction of motion.

4. The system recited in claim 1 wherein said second position corresponds to said reference position.

5. The system recited in claim 1 wherein said legs of the arm of said linear manipulator are coupled to move at an angular rate relative to each other which is twice the angular rate by which either leg moves relative to said element holder.

6. The system recited in claim 1 wherein said controlling means can move said linear manipulator to deliver said element on said holder to a workstation.

7. The system recited in claim 1 wherein said element is a semiconductor wafer.

8. The system recited in claim 1 wherein said means for determining said first position comprises means for rotating said element on said pedestal to detect an edge of said element during rotation.

9. A system for combined element transport and alignment comprising:

a pedestal having a reference position;

means for characterizing a first position of an element having a centroid and a flat on said pedestal, said first position including an offset of the centroid and an angle of the flat of said element relative to said reference position and means for positioning the element in a second position having a predetermined angle relative to said reference position;

a linear manipulator having an element holder on an articulated two leg arm, having means for angling the legs of the arm to produce a first direction of motion for said holder along a straight line coinciding with said predetermined angle of said second position, having means for providing both a second direction of motion about an axis and a third direction of motion in elevation, and having means for maintaining the angular position of the holder during motion of the holder in the first direction; and means for controlling the movement of the linear manipulator to move said element on said holder in said straight line as a function of said offset.

10. The system recited in claim 9 wherein said characterizing and positioning means comprises means for rotating said element and detecting an edge of said element during rotation.

11. The system recited in claim 9 wherein said linear manipulator legs are coupled to move at an angular rate relative to each other which is twice the angular rate by which either leg moves relative to said holder.

12. The system recited in claim 9 wherein said pedestal comprises a rotatable holding means for holding said element and wherein said reference position corresponds to a center of rotation of said holding means.

13. The system recited in claim 9 wherein said element is a semiconductor wafer.

14. The system recited in claim 9 wherein said controlling means can move said manipulator to place said element on said pedestal at said reference position.

15. The system recited in claim 9 wherein said angling means, said means for providing a second direction of motion about an axis and a third direction of motion in elevation are operative to deliver said element on said holder to a workstation.

16. A method for combined element transport and alignment comprising the steps of:

determining a first position of an element having a centroid and a flat on a pedestal, said first position including an offset of the centroid and an angle of the flat of said element relative to a reference position of said pedestal;

supporting said element on an element holder comprising an articulated two leg arm having means for angling the legs of the arm to produce a first direction of motion for said holder along a straight line, having means for providing both a second direction of motion about an axis and a third direction of motion in elevation, and having means for maintaining the angular position of the holder during motion of the holder in the first direction; and moving said element on said holder to a second position, wherein said second position has associated therewith a predetermined offset of the centroid and angle of the flat relative to said reference position.

17. The method recited in claim 16 wherein said determining step comprises the steps of rotating said element on said pedestal and detecting an edge of said element during rotation.

18. The method recited in claim 16 wherein said step of supporting said element on said holder comprises the step of moving said manipulator legs at an angular rate relative to each other which is twice the angular rate by which either leg moves relative to said holder.

19. The method recited in claim 16 wherein said moving step comprises the step of moving said element to said second position with said predetermined angle of said flat associated with said second position corresponding to said straight line.

20. The method recited in claim 16 wherein said moving step further comprises the step of placing said element on said pedestal with said centroid at said reference position.

21. The method recited in claim 16 wherein said moving step comprises the step of placing said element on a workstation.

\* \* \* \* \*

UNITED STATES PATENT AND TRADEMARK OFFICE
CERTIFICATE OF CORRECTION

PATENT NO. : 5,456,561
DATED : October 10, 1995
INVENTOR(S) : Noel S. Poduje, et al It is certified that error appears in the above-indentified patent and that said Letters Patent is hereby corrected as shown below:

On the cover page, the terminal disclaimer date is incorrect based on the terminal disclaimers previously filed in the related U.S. Applications. The language should read as follows:

--[*] Notice: The portion of the term of this patent subsequent to March 7, 2009 has been disclaimed.--

Column 5, line 37, "and means for" should read --and for--.

Signed and Sealed this

Tenth Day of September, 1996

Attest:

BRUCE LEHMAN

*Attesting Officer*      *Commissioner of Patents and Trademarks*